(12) United States Patent
Schmidhammer

(10) Patent No.: US 11,095,268 B2
(45) Date of Patent: Aug. 17, 2021

(54) RF FILTER

(71) Applicant: Snaptrack Inc., San Diego, CA (US)

(72) Inventor: Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 15/316,145

(22) PCT Filed: Aug. 11, 2015

(86) PCT No.: PCT/EP2015/068485
§ 371 (c)(1),
(2) Date: Dec. 2, 2016

(87) PCT Pub. No.: WO2016/026738
PCT Pub. Date: Feb. 25, 2016

(65) Prior Publication Data
US 2017/0141757 A1 May 18, 2017

(30) Foreign Application Priority Data
Aug. 20, 2014 (DE) .......................... 102014111912.6

(51) Int. Cl.
*H03H 9/64* (2006.01)
*H03H 9/60* (2006.01)
(Continued)

(52) U.S. Cl.
CPC ............... *H03H 9/64* (2013.01); *H03H 7/38* (2013.01); *H03H 9/542* (2013.01); *H03H 9/568* (2013.01);
(Continued)

(58) Field of Classification Search
CPC .................................. H03H 9/64; H03H 7/38
(Continued)

(56) References Cited

U.S. PATENT DOCUMENTS 5,617,065 A  4/1997 Dydyk
6,404,302 B1  6/2002 Satoh et al.
(Continued)

FOREIGN PATENT DOCUMENTS

CN  1293833 A  5/2001
CN  101084623 A  12/2007
(Continued)

OTHER PUBLICATIONS

Hassan, M.E. et al., "A New Method to Reconfigure BAW-SMR Filters Using CMOS Transistors," 2007 IEEE, IXL Microelectronics Laboratory—UMR 5818 CNRS-ENSEIRB—University of Bordeaux, 2007, 4 pages.
(Continued)

*Primary Examiner* — Samuel S Outten

(57) ABSTRACT

An RF filter is disclosed. In an embodiment, the RF filter includes series-interconnected basic elements, each basic element having an electroacoustic resonator and impedance converters interconnected in series between the basic elements, wherein the impedance converters are impedance inverters and/or admittance inverters, and wherein the resonators of the basic elements are either only series resonators or only parallel resonators.

7 Claims, 15 Drawing Sheets

(51) Int. Cl.
*H03H 9/54* (2006.01)
*H03H 9/56* (2006.01)
*H03H 7/38* (2006.01)
*H03H 9/72* (2006.01)
*H03H 9/02* (2006.01)
*H03H 9/70* (2006.01)

(52) U.S. Cl.
CPC .......... *H03H 9/605* (2013.01); *H03H 9/6483* (2013.01); *H03H 9/706* (2013.01); *H03H 9/725* (2013.01); *H03H 2009/02165* (2013.01)

(58) Field of Classification Search
USPC .......................................................... 333/32
See application file for complete search history.

(56) References Cited

U.S. PATENT DOCUMENTS

| | | | |
|---|---|---|---|
| 8,207,799 | B2 | 6/2012 | Beaudin et al. |
| 8,310,321 | B2 | 11/2012 | Kadota |
| 2004/0246077 | A1 | 12/2004 | Misu et al. |
| 2005/0148312 | A1 | 7/2005 | Toncich et al. |
| 2005/0212612 | A1 | 9/2005 | Kawakubo et al. |
| 2006/0119453 | A1 | 6/2006 | Fattinger et al. |
| 2007/0296521 | A1 | 12/2007 | Schmidhammer |
| 2008/0129411 | A1* | 6/2008 | Beaudin ................ H03H 9/542 333/133 |
| 2008/0309430 | A1* | 12/2008 | Tsuzuki ............... H03H 7/0153 333/174 |
| 2009/0002102 | A1 | 1/2009 | Tsuzuki et al. |
| 2010/0134203 | A1 | 6/2010 | Inoue et al. |
| 2010/0156600 | A1 | 6/2010 | Duron et al. |
| 2012/0235877 | A1 | 9/2012 | Beaudin et al. |
| 2012/0313731 | A1 | 12/2012 | Burgener et al. |
| 2012/0313737 | A1 | 12/2012 | Burgener et al. |
| 2013/0170405 | A1 | 7/2013 | Yan et al. |

FOREIGN PATENT DOCUMENTS

| | | | |
|---|---|---|---|
| CN | 102725959 | A | 10/2012 |
| DE | 102004031397 | A1 | 1/2006 |
| DE | 102004054895 | B4 | 5/2006 |
| DE | 112009003528 | T5 | 8/2014 |
| EP | 0949756 | A2 | 10/1999 |
| EP | 2530838 | A1 | 12/2012 |
| JP | 2000323961 | A | 11/2000 |
| JP | 2002510928 | A | 4/2002 |
| JP | 2010532146 | A | 9/2010 |
| JP | 2014502803 | A | 2/2014 |
| JP | 2016508303 | A | 3/2016 |
| WO | 9923757 | A1 | 5/1999 |
| WO | 9952208 | A1 | 10/1999 |
| WO | 2006045176 | A1 | 5/2006 |
| WO | 2009003190 | A1 | 12/2008 |
| WO | 2010027310 | A1 | 3/2010 |
| WO | 2012079038 | A2 | 6/2012 |
| WO | 2014145113 | A2 | 9/2014 |

OTHER PUBLICATIONS

Lu, X. et al., "Reconfigurable Multiband SAW Filters for LTE Applications," IEEE SiRF 2013, 3 pages.
Zverev, A.I., "Impedence and Admittance Inverters," Handbook of Filter Synthesis, John Wiley and Sons Ltd., Jan. 1, 1967, 10 pages.
International Search Report and Written Opinion—PCT/EP2015/068485—ISA/EPO—dated Nov. 25, 2015.
Tagami T., et al., "Resonator Type SAW Filter," Special Issue on Electronic Components, OKI Technical Review 158, XP000699796, vol. 63, Apr. 1997, 6 pages.

* cited by examiner

RF FILTER

This patent application is a national phase filing under section 371 of PCT/EP2015/068485, filed Aug. 11, 2015, which claims the priority of German patent application 10 2014 111 912.6, filed Aug. 20, 2014, each of which is incorporated herein by reference in its entirety.

TECHNICAL FIELD

The invention relates to RF filters which can be used, e.g., in portable communication devices.

BACKGROUND

Portable communication devices, e.g., mobile radio devices, in the meantime can enable communication in a multiplicity of different frequency bands and for a multiplicity of different transmission systems. To that end, they generally comprise a multiplicity of RF filters each provided for the corresponding frequency and the corresponding transmission system. Although modern RF filters in the meantime can be produced with small dimensions, on account of their multiplicity and the complexity of their interconnection the front-end modules in which the filters are arranged are nevertheless relatively large and their production is complex and expensive.

Tunable RF filters could remedy this. Such filters have a center frequency that is adjustable, for which reason a tunable filter, in principle, can replace two or more conventional filters. Tunable RF filters are known, e.g., from the documents US 2012/0313731 A1 or EP 2530838 A1. In this case, the electroacoustic properties of resonators operating with acoustic waves are altered by tunable impedance elements.

The paper "Reconfigurable Multiband SAW Filters for LTE Applications", IEEE SiRF 2013, pp. 153-155, by Lu et al., discloses filters that are reconfigurable by means of switches.

What is problematic about known tunable RF filters, however, is, in particular, the fact that the tuning itself alters important properties of the filters. In this regard, e.g., the insertion loss, the input impedance and/or the output impedance change(s) during tuning.

SUMMARY OF THE INVENTION

Embodiments of the invention provide RF filters which enable tuning without altering other important parameters and which make available to the person skilled in the art additional degrees of freedom when designing filter modules.

In various embodiments the RF filter comprises series-interconnected basic elements each having an electroacoustic resonator. The filter furthermore comprises impedance converters interconnected in series between the basic elements. The impedance converters are impedance inverters and/or admittance inverters. The resonators of the basic elements are either only series resonators or only parallel resonators.

Basic elements in RF filters are known from ladder-type structures, for example, where a basic element comprises a series resonator and a parallel resonator. A plurality of such basic elements connected in series substantially brings about the filter effect if the resonant frequencies and the antiresonant frequencies of the series and parallel resonators are tuned suitably in relation to one another.

The basic elements present here can be interpreted in this regard to a certain extent as halved basic elements of a ladder-type circuit.

Impedance inverters or admittance inverters are appropriate as impedance converters. While an impedance converter transforms an arbitrary transformation of a load impedance into an input impedance, the effect of the impedance inverter or admittance inverter is distinctly concretized. Impedance inverters or admittance inverters can be described as follows using the auxiliary aids for two-port networks.

The chain matrix having the matrix elements A, B, C, D describes the effect of a two-port network connected to a load by its output port, by said chain matrix stipulating how a voltage $U_L$ dropped across a load and a current $I_L$, flowing through a load are transformed into a voltage $U_{IN}$ present at the input port and a current $I_{IN}$ flowing into the input port:

$$\begin{pmatrix} U_{IN} \\ I_{IN} \end{pmatrix} = \begin{pmatrix} A & B \\ C & D \end{pmatrix} \begin{pmatrix} U_L \\ I_L \end{pmatrix} \tag{1}$$

The impedance Z is defined here as the ratio between voltage and current:

$$Z = \frac{u}{i} \tag{2}$$

A load impedance $Z_L$ is thus transformed into an input impedance $Z_{IN}$:

$$Z_{IN} = \frac{AZ_L + B}{CZ_L + D} \tag{3}$$

From outside, therefore the load impedance $Z_L$ looks like the input impedance $Z_{IN}$.

An impedance inverter is then characterized by the following chain matrix:

$$\begin{pmatrix} A & B \\ C & D \end{pmatrix}_K = \begin{pmatrix} 0 & iK \\ i/K & 0 \end{pmatrix} \tag{4}$$

It follows from this that $$Z_{IN} = \frac{K^2}{Z_L} \tag{5}$$

The impedance is inverted. The proportionality factor is $K^2$.

An admittance inverter is characterized by the following chain matrix:

$$\begin{pmatrix} A & B \\ C & D \end{pmatrix}_J = \begin{pmatrix} 0 & i/J \\ iJ & 0 \end{pmatrix} \tag{6}$$

It follows from this for the admittance Y that:

$$Y_{IN} = \frac{J^2}{Y_L} \tag{7}$$

The admittance is inverted. The proportionality factor is $J^2$.

It has been found that joint presence of parallel resonators and series resonators has distinct effects on the variability of important parameters when tuning the RF filter. It has furthermore been found that tuning has less influence on said parameters if only one type of resonators is present. Therefore, if only series resonators or only parallel resonators are present, the RF filter behaves more stably with regard to the insertion loss, the input impedance and/or the output impedance during tuning. It has additionally been found that the abovementioned impedance converters are suitable for causing series resonators to appear as parallel resonators, and vice versa. In particular, a series interconnection of two impedance inverters with a series resonator therebetween looks like a parallel resonator to the circuit environment thereof. A series interconnection of two admittance inverters with a parallel resonator therebetween looks like a series resonator to the circuit environment thereof.

These series interconnections thus make it possible to create RF filter circuits which are better tunable.

It is thus possible to configure the RF filter such that the impedance converters are impedance inverters and the resonators are series resonators.

Such filters do not require any parallel resonators. If the filters are configured as bandpass filters or as band-stop filters, then these generally have a steep right-hand edge. The filter can be used in a duplexer. Preferably as a transmission filter owing to the steep right-hand edge. Specifically if the transmission band is below the reception band. If the relative arrangement of transmission band and reception band is interchanged, the filter with series resonators is preferably in the reception filter.

It is furthermore also possible to configure the RF filter such that the impedance converters are admittance inverters and the resonators are parallel resonators.

Such filters do not require any series resonators. If the filters are configured as bandpass filters or as band-stop filters, then these generally have a steep left-hand edge. The filter can also be used in a duplexer. Preferably as a reception filter owing to the steep left-hand edge. Specifically if the reception band is above the transmission band. If the relative arrangement of transmission band and reception band is interchanged, the filter with series resonators is preferably in the transmission filter.

It is possible for the impedance converters to comprise both capacitive elements and inductive elements as impedance elements. However, it is also possible for the impedance converters to comprise only capacitive elements or only inductive elements. The impedance converters then consist only of passive circuit elements. Particularly if the impedance converters comprise only few or no inductive elements at all, they can easily be realized as structured metallizations in metal layers of a multilayer substrate.

It is possible for the impedance converters to comprise phase shifter lines in addition to inductive or capacitive elements. However, it is also possible for the impedance converters to consist of phase shifter lines. Phase shifter lines, too, can be integrated simply and with a compact construction in a multilayer substrate.

It is possible for the filter to be described by a symmetrical description matrix B.

There are filter circuits which are fully described by a description matrix B. The matrix B contains matrix elements which characterize the individual circuit components of the filter.

A filter circuit which comprises three series-interconnected resonators $R_1$, $R_2$, $R_3$ and is interconnected with a source impedance ZS on the input side and with a load impedance ZL on the output side would have the following form:

$$B = \begin{pmatrix} Z_S & 0 & 0 & 0 & 0 \\ 0 & R_1 & 0 & 0 & 0 \\ 0 & 0 & R_2 & 0 & 0 \\ 0 & 0 & 0 & R_3 & 0 \\ 0 & 0 & 0 & 0 & Z_L \end{pmatrix} \tag{8}$$

The circuit would not operate, however, as a bandpass filter.

If the two outer series resonators are masked by impedance inverters such that they appear in each case as parallel resonators, then a structure is obtained which behaves like a ladder-type structure and which is described by the following description matrix.

$$B = \begin{pmatrix} Z_S & K_{S1} & 0 & 0 & 0 \\ K_{S1} & R_1 & K_{12} & 0 & 0 \\ 0 & K_{13} & R_2 & K_{22} & 0 \\ 0 & 0 & K_{23} & R_3 & K_{3L} \\ 0 & 0 & 0 & K_{2L} & Z_L \end{pmatrix} \tag{9}$$

Here $K_{S1}$ denotes the impedance inverter between the source impedance $Z_S$ and the first resonator. $K_{12}$ denotes the impedance inverter between the first and second resonators. Generally, the indices of the variables of the inverters denote the resonators between which the corresponding inverters are arranged. It holds true that $B_{ij}=B_{ji}$, i.e., the matrix is symmetrical with respect to its diagonals. The filter circuit associated with equation (9) is shown in FIG. 1. The resonators are described by variables on the diagonal of the matrix. The impedance converters are described by variables on the secondary diagonals directly above and below the diagonal.

It is possible for the filter to comprise a second impedance converter connected in parallel with a segment of the filter. The segment comprises a series connection having a basic element and two impedance converters.

The description matrix then contains entries above the upper secondary diagonal and below the lower secondary diagonal.

It is possible for at least one of the resonators of the basic elements to be tunable.

In principle and particularly if one of the resonators is tunable, BAW resonators (BAW=Bulk Acoustic Wave), SAW resonators (SAW=Surface Acoustic Wave), GBAW resonators (GBAW=Guided Bulk Acoustic Wave) and/or LC resonators are appropriate. Resonator elements operating with acoustic waves substantially have an equivalent circuit diagram with a parallel connection formed by a capacitive element $C_O$, on the one hand, and a series connection having an inductive element $L_1$ and a capacitive element $C_1$, on the other hand. Such a resonator element has its resonant frequency at $$\omega_0 = \sqrt{\frac{1}{L_1 C_1}} \quad (10)$$

and its antiresonant frequency at $$\omega_P = \omega_0 \sqrt{1 + \frac{C_1}{C_0}} = \sqrt{\frac{1}{L_1 C_1}} \sqrt{1 + \frac{C_1}{C_0}} \quad (11)$$

If the resonator also comprises, besides the resonator element, tunable elements such as tunable inductive or capacitive elements connected in series and/or in parallel with the resonator element, then a resonator having a variable frequency behavior is formed. In this case, the resonant frequency is dependent on $L_1$ and $C_1$ but not on $C_O$. The antiresonance is additionally dependent on $C_O$. By varying the impedance of the tunable impedance elements, $C_O$ and $L_1$ of the equivalent circuit diagram can be varied independently of one another. The resonant frequency and the antiresonant frequency can thus be set independently of one another.

As an alternative to resonators having resonator elements whose characteristic frequencies are variable by means of tunable impedance elements, or in addition thereto, a tunable resonator can comprise an array of resonator elements, each element of which is coupleable to the resonator or disconnectable from the resonator by means of switches. An array of m resonator elements per tunable resonator is then involved. It is thus possible to construct RF filters which—depending on the presently active resonator element—can realize m different filter transmission curves. In this case, each of the m resonators can be assigned to exactly one filter transmission curve. However, it is also possible for a plurality of simultaneously active resonator elements to be assigned to a filter transmission curve. In this regard, m resonator elements enable up to m! (factorial of m) different filter transmission curves. In this case, m can be 2, 3, 4, 5, 6, 7, 8, 9, 10 or even more. If the resonator elements are connected in parallel, $2^m$ different filter transmission curves are possible.

In this case, the switches can be switches created in a semiconductor design such as CMOS switches (CMOS=Complementary metal oxide semiconductor), GaAs (gallium arsenide) based switches or JFET switches (JFET=Junction FET [FET=Field Effect Transistor]). MEMS switches (MEMS=Microelectromechanical System) are also possible and make excellent linear properties available.

It is therefore possible for all the resonators to be tunable to different frequency bands.

It is possible, in particular, for the tunability of the resonators to enable a compensation of a temperature fluctuation, an adjustment of the filter with regard to an impedance matching, an adjustment of the filter with regard to an insertion loss or an adjustment of the filter with regard to an isolation.

It is furthermore possible for each resonator to comprise the same number of resonator elements which are controllable via switches addressable via an MIPI interface (MIPI=Mobile Industry Processor Interface).

It is possible for one or more impedance converters to comprise or consist of passive impedance elements. The impedance converter can therefore comprise two parallel capacitive elements and one parallel inductive element. This is taken to mean transverse branches, e.g., relative to ground, which contain a corresponding capacitive and inductive element, respectively.

It is also possible for an impedance converter to comprise three parallel capacitive elements.

It is also possible for an impedance converter to comprise three parallel inductive elements.

It is also possible for an impedance converter to comprise two parallel inductive elements and one parallel capacitive element.

Computationally it may arise that individual impedance elements have to have negative impedance values, e.g., negative inductances or negative capacitances. However, negative impedance values are unproblematic at least if the corresponding impedance elements are to be interconnected with other impedance elements of the RF filter, such that the interconnection with the other elements has positive impedance values again in total. In this case, the interconnection of the elements actually provided would be replaced by the element having a positive impedance value.

It is furthermore possible for the RF filter to comprise two series-interconnected basic elements and a capacitive element interconnected in parallel with the two series-interconnected basic elements.

It is possible for the RF filter to comprise a signal path, four capacitive elements in the signal path, six switchable resonators each having a resonator element and a switch interconnected in series therewith in a transverse branch relative to ground, and an inductive element connected in parallel with two of the four capacitive elements.

Hereinafter, important principles are explained and a non-exhaustive enumeration of exemplary and schematic circuits illustrates central aspects of the RF filter.

DETAILED DESCRIPTION OF ILLUSTRATIVE EMBODIMENTS

Figure 1:
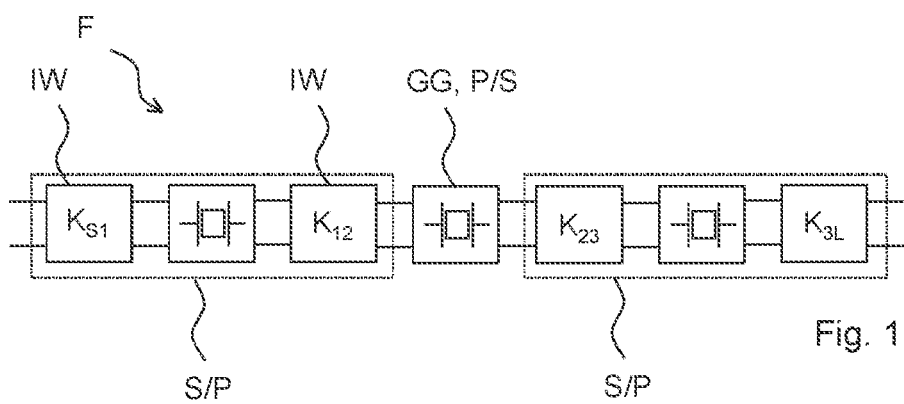
FIG. 1 shows an RF filter F having three resonators and four impedance converters.

FIG. 1 shows an RF filter circuit F having three resonators and four impedance converters IW. The central resonator here represents a basic element GG. The central resonator can be a parallel resonator P or a series resonator S. The two impedance converters IW surrounding the first resonator have the effect that the resonator looks like a series resonator or like a parallel resonator toward the outside. If the central resonator is a parallel resonator, then the first resonator can also be a parallel resonator that looks like a series resonator toward the outside. Correspondingly, the third resonator would then also be a parallel resonator that looks like a series resonator toward the outside. Conversely, the central resonator can be a series resonator S. The two outer resonators would then also be series resonators that look like parallel resonators toward the outside. In this regard, using the impedance converters IW a filter structure similar to a ladder-type can be obtained, even though exclusively series resonators or even though exclusively parallel resonators are used.

Figure 2:
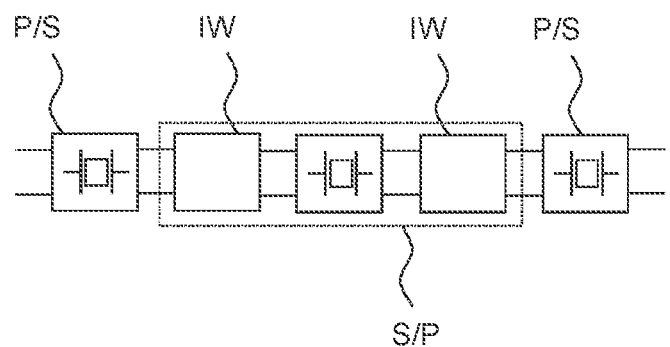
FIG. 2 shows a filter having three resonators and two impedance converters.

FIG. 2 shows a filter circuit in which the central resonator is masked by the impedance converters IW surrounding it such that the filter looks like an alternating sequence of parallel and series resonators toward the outside, even though only one type of resonator is used.

Figure 3:
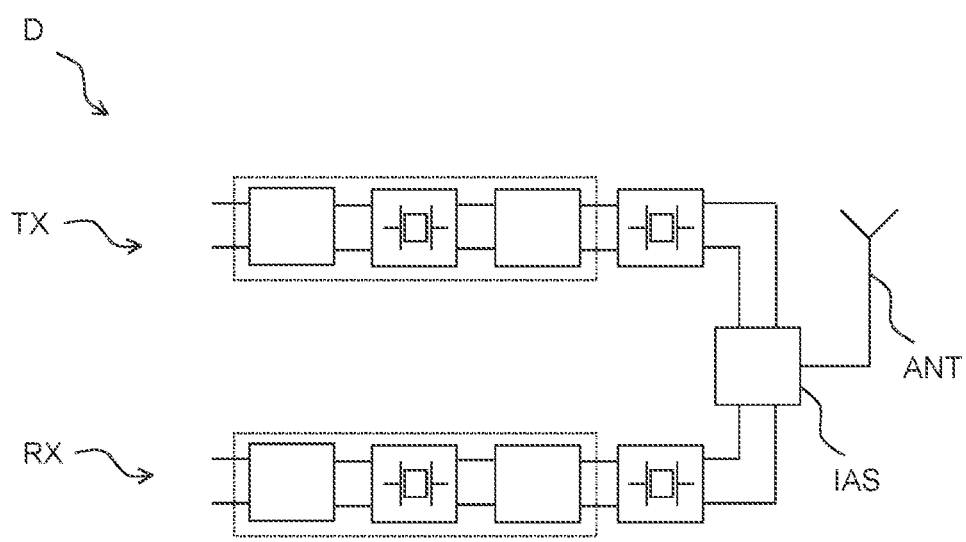
FIG. 3 shows a duplexer D having a transmission filter TX and a reception filter RX, which are interconnected with an antenna via an impedance matching circuit.

FIG. 3 shows a duplexer D in which both the transmission filter TX and the reception filter RX comprise series interconnections of impedance converters and resonators which are interconnected with one another such that only one type of resonators is necessary per filter. Since series resonators are suitable for forming a steep right-hand filter edge of a passband and since transmission frequency bands are generally below the reception frequency bands in terms of frequency, it is advantageous to use series resonators in the transmission filter TX. Parallel resonators could analogously be used in the reception filter RX. If the transmission frequency band is above the reception frequency band, then series resonators in the reception filter and parallel resonators in the transmission filter would correspondingly be advantageous.

The filters TX, RX are interconnected with an antenna ANT via an impedance matching circuit IAS. From the point of view of the impedance matching circuit IAS, each of the two filters TX, RX looks like a conventional ladder-type filter circuit, such that in practice no additional outlay is necessary when designing the other circuit components such as antenna and impedance matching circuit.

Figure 4:
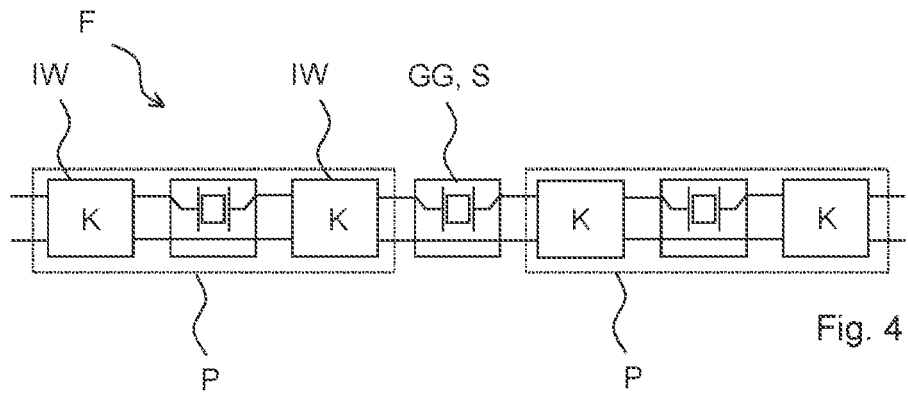
FIG. 4 shows an RF filter F exhibiting interconnection of centrally a series resonator S and peripherally in each case a series resonator with two impedance converters.

FIG. 4 correspondingly shows an embodiment in which the central resonator is embodied as a series resonator S. By virtue of the effect of the impedance converters IW, a series resonator element can in each case be used in the two outer resonators as well, even though the combination of impedance converters and series resonator looks and is manifested like a parallel resonator P toward the outside. In order to cause series resonators to look like parallel resonators toward the outside, impedance inverters K are preferably used.

Figure 5:
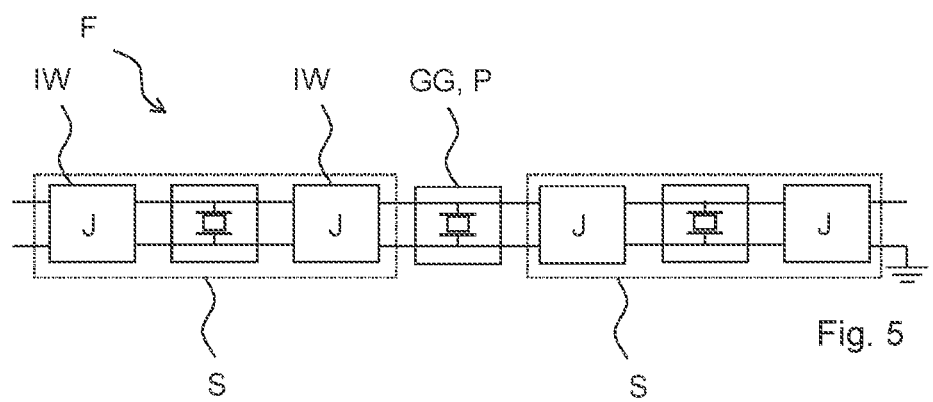
FIG. 5 shows an RF filter F which comprises exclusively parallel resonators as resonators used.

In contrast thereto, FIG. 5 shows an embodiment of an RF filter F in which exclusively parallel resonators are used. Using admittance inverters J as embodiments of the impedance converters IW, the two outer parallel resonators appear as series resonators S. Together with the central, middle resonator, a parallel resonator P, the RF filter F forms a quasi-ladder-type structure.

Figure 6:
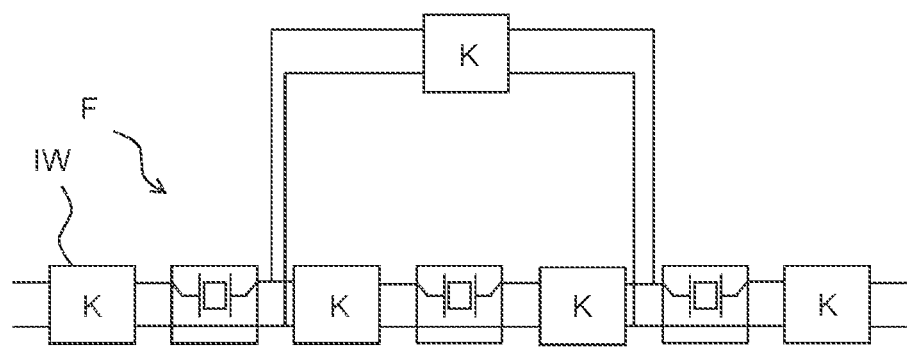
FIG. 6 shows an RF filter F in which an impedance converter interconnects a first resonator directly with a third resonator.

FIG. 6 shows an embodiment in which the two outer resonators are directly interconnected via a further impedance converter, e.g., an impedance inverter. The direct interconnection of the outer resonators via a further impedance converter represents a new degree of freedom via which an RF filter can be further optimized.

Figure 7:
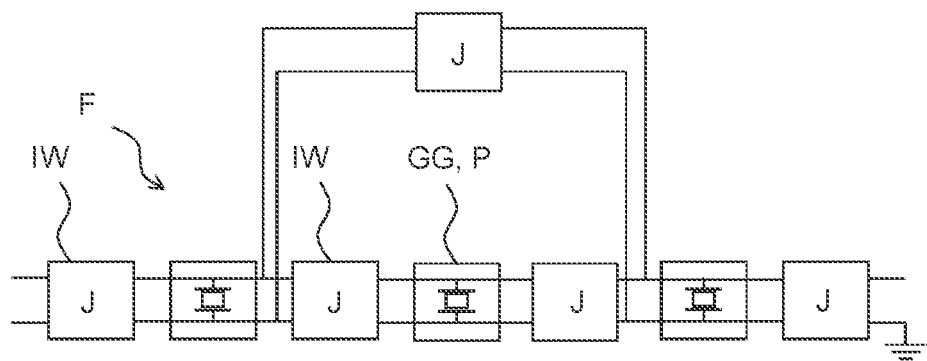
FIG. 7 shows an RF filter F in which an admittance inverter directly interconnects a first resonator with a third resonator.

FIG. 7 shows, for example, an embodiment of an RF filter F which uses parallel resonators and admittance inverters J. In this case, the two outer resonators are also directly interconnected with one another via a further admittance inverter J.

Figure 8:
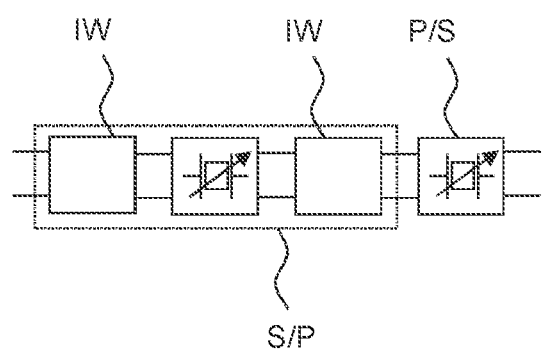
FIG. 8 shows an RF filter having tunable resonators.

FIG. 8 shows a possible embodiment of an RF filter in which the resonators are tunable.

FIG. 9 shows a possible embodiment of a tunable resonator R. The resonator R comprises a resonator element RE. The resonator element RE here may be a resonator element operating with acoustic waves. A capacitive element CE is interconnected in parallel with the resonator element RE. A further capacitive element CE is interconnected in series with the parallel interconnection. The two capacitive elements CE are tunable, that is to say that their capacitance can be adjusted. Depending on capacitive elements used, the capacitance can be adjusted continuously or in discrete values. If the capacitive elements comprise varactors, for example, then the capacitance can be continuously adjusted by applying a bias voltage. If a capacitive element CE comprises a bank of capacitive individual elements which can be driven individually by means of one or more switches, then the capacitance of the corresponding capacitive element CE can be adjusted in discrete steps.

Figure 9A:
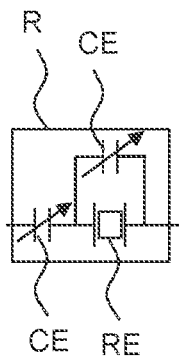
FIG. 9A to FIG. 9K show various embodiments of tunable resonators.
Figure 9B:
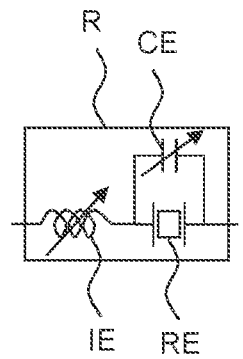

FIG. 9B shows an alternative possibility of a resonator R in which the series interconnection of a tunable capacitive element CE with a resonator element RE is interconnected in series with a tunable inductive element IE.

Figure 9C:
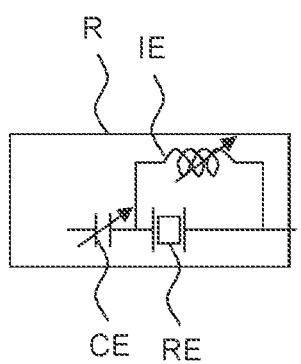

FIG. 9C shows a possible embodiment of a tunable resonator R in which a resonator element RE is interconnected in parallel with a tunable inductive element IE.

This parallel connection is interconnected in series with a tunable capacitive element CE.

Figure 9D:
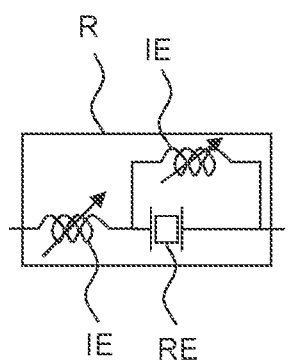

FIG. 9D shows a further alternative embodiment for a tunable resonator R. In this case—in comparison with FIG. 9C—the parallel connection is interconnected in series with a tunable inductive element IE.

Figure 9E:
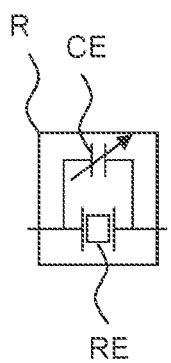

FIG. 9E shows a further alternative embodiment of a tunable resonator in which a resonator element RE is only interconnected in parallel with a tunable capacitive element CE.

Figure 9F:
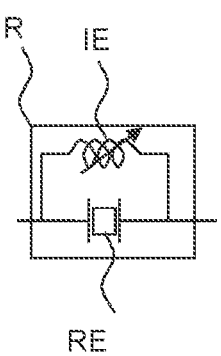

FIG. 9F shows a further alternative embodiment of a tunable resonator R. In this case, a resonator element RE is interconnected in parallel with a tunable inductive element IE.

FIGS. 9E and 9F show relatively simple embodiments of a tunable resonator R. FIGS. 9A to 9D show embodiments of a tunable resonator R which enable further degrees of freedom in tuning by means of a further tunable element. In this regard, the embodiments shown can be interconnected in series or in parallel with further capacitive and inductive elements having a fixed impedance or variable impedance, in order to obtain additional degrees of freedom, e.g., for a wider tuning range.

Figure 9G:
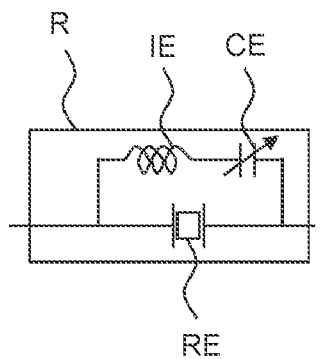

FIG. 9G shows an embodiment of a tunable resonator R in which the resonator element RE is interconnected in parallel with a series interconnection comprising an inductive element IE and a tunable capacitive element CE.

Figure 9H:
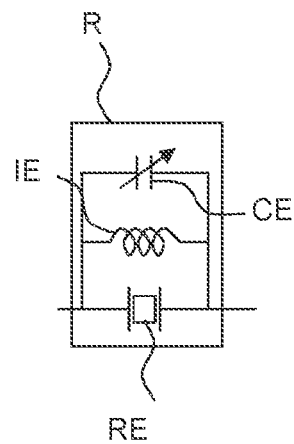

FIG. 9H shows an embodiment of a tunable resonator R in which the resonator element RE is interconnected in parallel with a parallel interconnection comprising an inductive element IE and a tunable capacitive element CE.

Figure 9I:
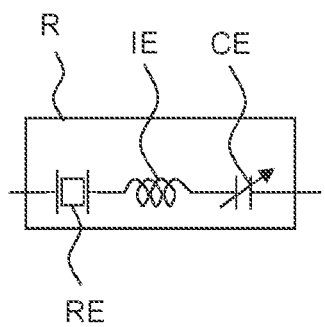

FIG. 9I shows an embodiment of a tunable resonator R in which the resonator element RE is interconnected in series with a series interconnection comprising an inductive element IE and a tunable capacitive element CE.

Figure 9J:
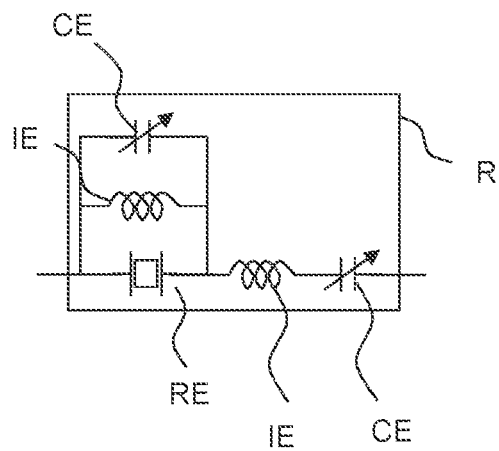

FIG. 9J shows an embodiment of a tunable resonator R in which the resonator element RE is interconnected, on the one hand, in series with a series interconnection comprising an inductive element IE and a tunable capacitive element CE and, on the other hand, in parallel with a parallel interconnection comprising an inductive element IE and a tunable capacitive element CE.

Figure 9K:
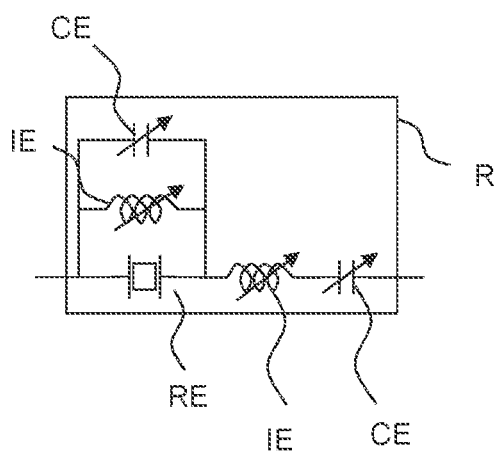

FIG. 9K shows an embodiment of a tunable resonator R in which the resonator element RE is interconnected, on the one hand, in series with a series interconnection comprising a tunable inductive element IE and a tunable capacitive element CE and, on the other hand, in parallel with a parallel interconnection comprising a tunable inductive element IE and a tunable capacitive element CE.

It furthermore holds true that switchable tunable elements, e.g., varactors that can be switchably connected in by means of switches, are also possible besides continuously tunable elements such as varactors and switchable elements having a constant impedance.

It holds true even more generally that in a resonator the resonator element can be interconnected in series with a series network and in parallel with a parallel network. In this case, the series network and the parallel network can each comprise impedance elements having a fixed or variable impedance.

Figure 10A:
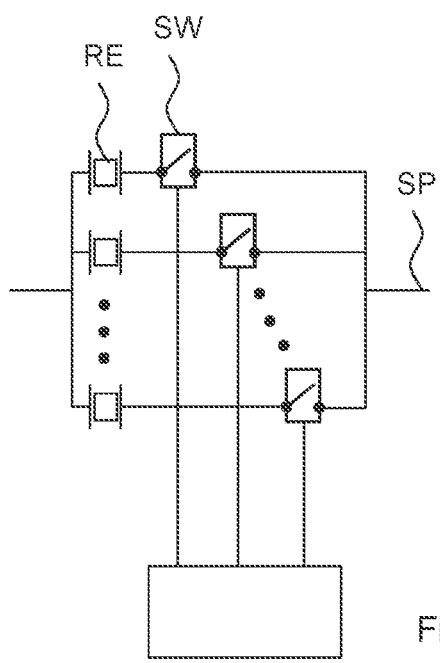
FIG. 10A shows a tunable resonator having series resonator elements that are activatable by switches.

FIG. 10 shows an additional possible embodiment of a tunable resonator R comprising a multiplicity of resonator elements RE and a multiplicity of switches SW. In this case, FIG. 10A shows resonator elements RE which are interconnected in series in the signal path SP. A tunable series resonator is thus illustrated. By individually opening and closing the individual switches SW, it is possible to couple, in an individually adjustable manner, specific resonator elements RE into the signal path SP. If the tunable resonator R in FIG. 10A comprises m resonator elements RE, then $2^m$ different switching states can be obtained.

Figure 10B:
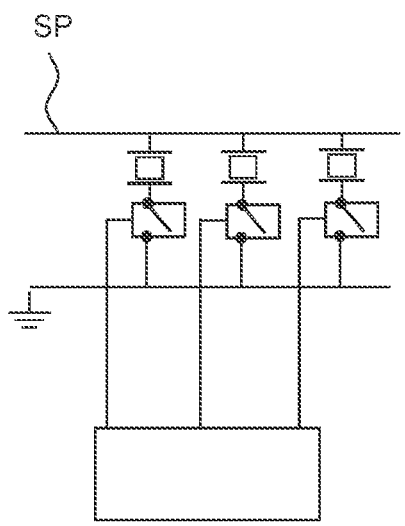
FIG. 10B shows a tunable resonator having parallel resonators that are activatable by means of switches.

FIG. 10B shows an embodiment of a tunable resonator R in which resonator elements interconnect the signal path SP with ground. Since the order of the individual resonator elements RE in which they are interconnected with the signal path SP is relevant, in principle, m! (factorial) different resonator states can be obtained.

FIGS. 11A to 11F indicate various embodiments of an impedance inverter.

Figure 11A:
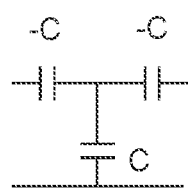
FIG. 11A to FIG. 11F show various embodiments of an impedance inverter.

FIG. 11A thus shows a form of an impedance converter which represents an impedance inverter. Two capacitive elements are interconnected in series in the signal path. A capacitive element interconnects the common circuit node of the two capacitive elements in the signal path with ground. The capacitive elements in the signal path computationally acquire a negative capacitance $-C$. The capacitive element in the parallel path relative to ground computationally acquires a positive capacitance C.

As already described above, the capacitance values arise merely from the calculation specifications for two ports. Thus, on no account does the T-circuit shown in FIG. 11A need to be realized in this way in a circuit environment. Rather, the capacitive elements having a negative capacitance in the series path can be combined with further capacitive elements having a positive capacitance which are additionally interconnected in the series path, such that overall in each case one or more capacitive elements having a positive capacitance are obtained.

Figure 11B:
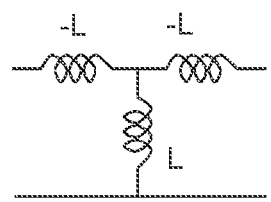
Figure 11C:
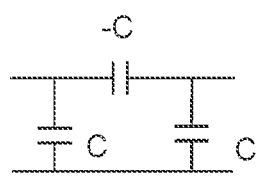
Figure 11D:
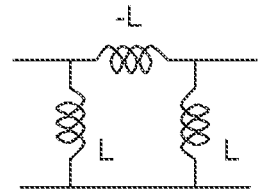

The same applies to the embodiments in FIGS. 11B, 11C and 11D and to the embodiments of the admittance inverters in FIGS. 12A, 12B, 12C and 12D.

FIG. 11B shows a T-circuit composed of inductive elements, wherein the two inductive elements interconnected in series in the signal path purely formally have to have a negative inductance.

FIG. 11C shows a form of an impedance inverter having a Pi-circuit with a capacitive element having a negative capacitance in the series path and two capacitive elements having a positive capacitance in each case in a parallel path.

FIG. 11D shows an embodiment of an impedance inverter in Pi-form in which the inductance of the inductive element in the signal path is negative. The inductances of the inductive elements in the corresponding two parallel paths are positive.

Figure 11E:
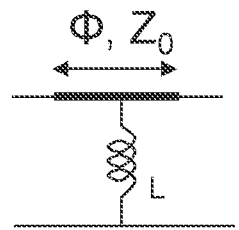

FIG. 11E shows an embodiment of an impedance inverter having a phase shifter circuit and an inductive element having the inductance L. In this case, the phase shifter circuit preferably has the characteristic impedance of the signal line $Z_O$. The phase offset $\Theta$ as a result of the phase shifter circuit is set in a suitable manner.

In this regard, Θ in the case of an impedance inverter can be determined, e.g., by the equation $$\Theta = -\tan^{-1}\frac{2X}{Z_0}.$$

In this case, $$X = \frac{K}{1-\left(\frac{k}{Z_0}\right)^2}$$

and K is determined by $$Z_{in} = \frac{K^2}{Z_l}.$$

In the case of an admittance inverter, the following can hold true:

$$\Theta = -\tan^{-1}\frac{2B}{Y_0}.$$

In this case, $$B = \frac{J}{1-\left(\frac{J}{Y_0}\right)^2}$$

and J is determined by $$Y_{in} = \frac{J^2}{Z_l}.$$

Figure 11F:
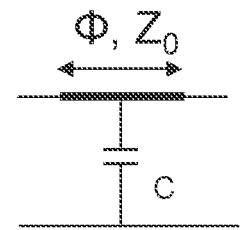

Analogously to FIG. 11E, FIG. 11F shows an alternative embodiment in which the inductive element is replaced by a capacitive element having the capacitance C.

FIGS. 12A to 12F show embodiments of an admittance inverter.

Figure 12A:
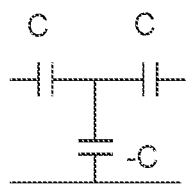
FIG. 12A to FIG. 12F show various embodiments of an admittance inverter.

FIG. 12A shows an embodiment of an admittance inverter in a T-configuration in which the two capacitive elements in the series path have positive capacitances. The capacitive element in the parallel path nominally has a negative capacitance.

Figure 12B:
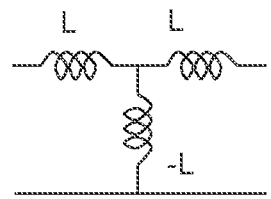

FIG. 12B shows an embodiment of an admittance inverter in a T-configuration, wherein two inductive elements having the inductance L are interconnected in series in the signal path. An inductive element having the negative inductance –L is interconnected in a parallel path which interconnects two electrodes of the inductive elements with ground.

Figure 12C:
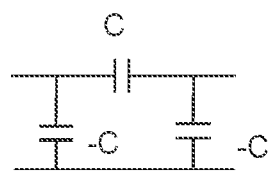

FIG. 12C shows an embodiment of an admittance inverter in a Pi-configuration, wherein the two capacitive elements in the two parallel paths have a negative capacitance. The capacitive element in the signal path has a positive capacitance.

Figure 12D:
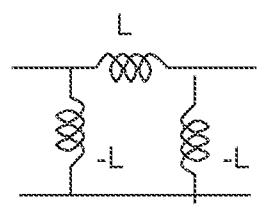

FIG. 12D shows an embodiment of an admittance inverter in a Pi-configuration having three inductive elements. The inductive element in the series path has a positive inductance. The two inductive elements in the two parallel paths in each case have a negative inductance.

Figure 12E:
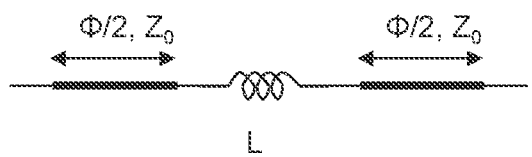

FIG. 12E shows an embodiment of an admittance inverter in which an inductive element having a positive inductance L is interconnected between two segments of a phase shifter circuit. Each segment of the phase shifter circuit has a characteristic impedance $Z_O$ and suitably shifts the phase.

Figure 12F:
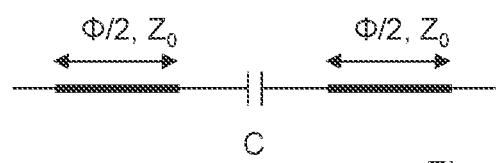

In a manner corresponding to FIG. 12E, FIG. 12F shows an embodiment of an admittance inverter which is likewise based on phase shifter circuits. A capacitive element having a positive capacitance C is interconnected between two segments of a phase shifter circuit.

FIG. 13 shows the use of tunable resonators R together with impedance converters IW. In this case, the resonator can be a series resonator. Through the use of impedance inverters K as impedance converters IW, a combination of two impedance converters IW and a series resonator interconnected therebetween produces overall a parallel resonator.

Figure 13A:
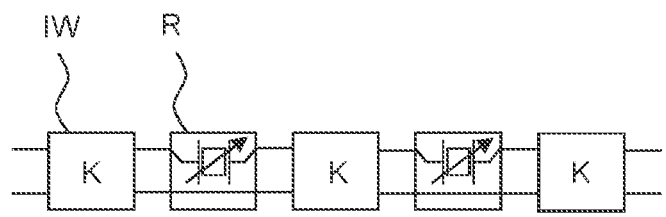
FIG. 13A to FIG. 13C show various abstraction stages in the design of an RF filter.
Figure 13B:
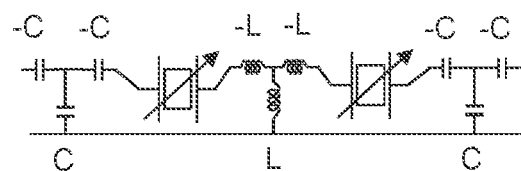

If the impedance converters IW in FIG. 13A are replaced by impedance inverters such as are known, for example, from FIGS. 11A to 11F, e.g., 11A, then the circuit structure in FIG. 13B is obtained. The capacitive elements having a negative capacitance appear to be problematic. However, if it is taken into account that the resonators R themselves have properties of capacitive elements having a positive capacitance, then the need for capacitive elements having a negative capacitance which are interconnected directly with the resonator elements is obviated. This is shown in FIG. 13C.

Figure 13C:
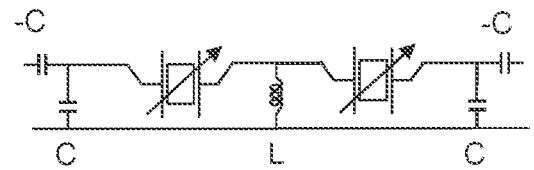
Figure 14A:
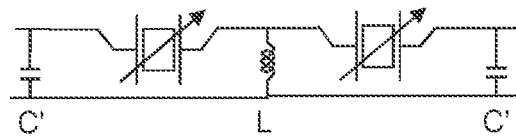
FIG. 14A to FIG. 14H show various concrete embodiments of an RF filter having two tunable series resonators and three impedance converters.

If capacitive elements interconnected in the circuit environment of the RF filter are furthermore taken into account, then the need for the peripheral capacitive elements having a negative capacitance in FIG. 13C is also obviated. Overall, a circuit structure as shown in FIG. 14A is then obtained. Even if an external circuit environment of the RF filter does not provide a possibility for compensation of the negative capacitances –C in FIG. 13, the negative capacitance can be compensated for by the positive capacitance of the capacitive element in the parallel path.

FIG. 14A thus shows an RF filter circuit which is simple to produce and which has two tunable resonators and three impedance elements, the impedance of which is chosen such that one of the two resonators acts as a parallel resonator. FIG. 14A thus substantially shows a basic element of a ladder-type filter circuit, even though only series resonators are used.

Figure 14B:
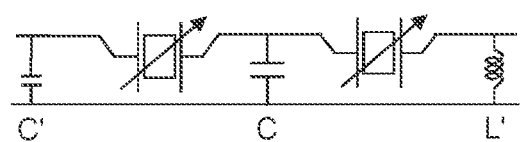

FIG. 14B shows an alternative to the RF filter in FIG. 14A, since the inductive element L between the resonators is replaced by a capacitive element C and the capacitive element in the load-side parallel path is replaced by an inductive element.

Figure 14C:
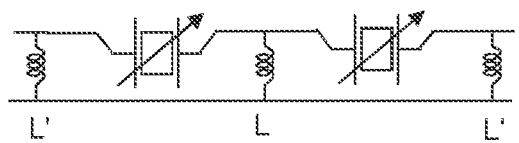

FIG. 14C shows a further embodiment of an RF filter having two resonators, wherein three inductive elements in each case in a parallel path are interconnected.

Figure 14D:
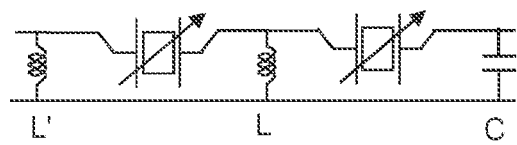

FIG. 14D shows a possible embodiment of an RF filter in which the two left impedance elements are formed by inductive elements and the right impedance element is formed by a capacitive element.

Figure 14E:
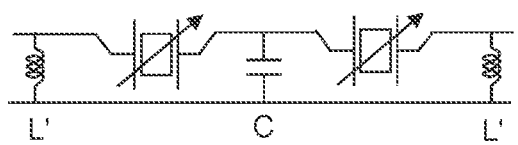

FIG. 14E shows an embodiment in which the outer two impedance elements are formed by inductive elements and the central impedance element is formed by a capacitive element.

Figure 14F:
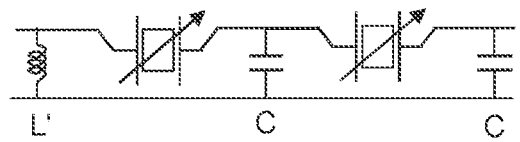

FIG. 14F shows an embodiment in which the two right impedance elements are formed by capacitive elements and the left impedance element is formed by an inductive element.

Figure 14G:
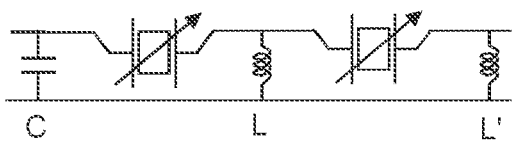

FIG. 14G shows an embodiment in which the two right impedance elements are formed by inductive elements and the left impedance element is formed by a capacitive element.

Figure 14H:
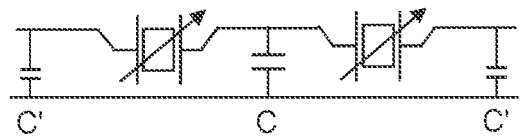
Figure 15A:
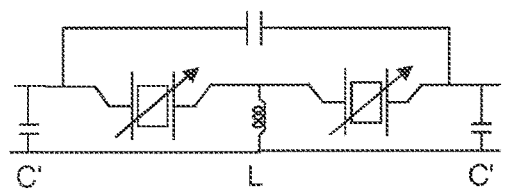
FIG. 15A to FIG. 15H show configurations of an RF filter having two tunable resonators, three impedance converters and in each case a bridging capacitive element.
Figure 15B:
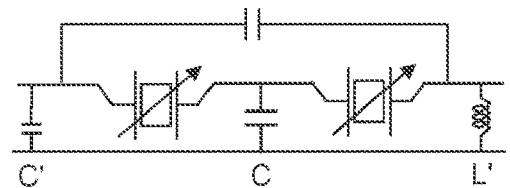
Figure 15C:
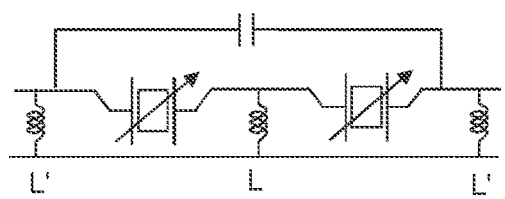
Figure 15D:
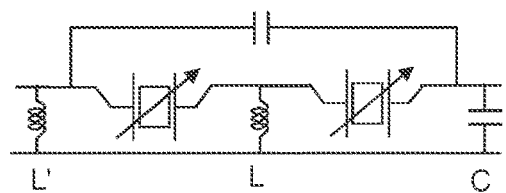
Figure 15E:
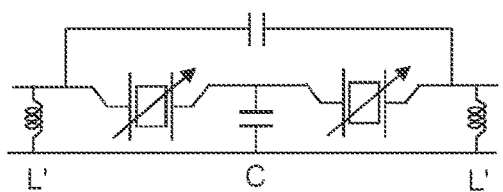
Figure 15F:
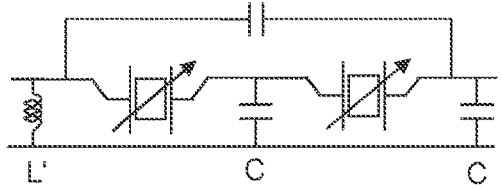
Figure 15G:
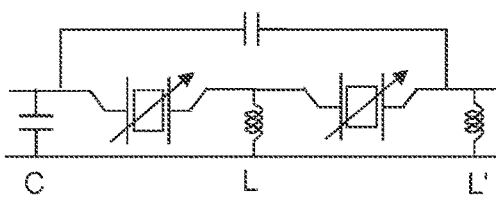
Figure 15H:
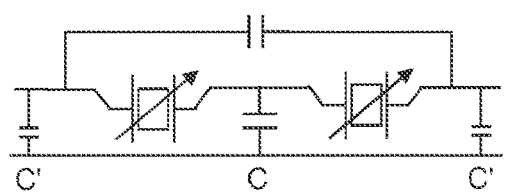

FIG. 14H shows an embodiment in which all three impedance elements are formed by capacitive elements.

FIGS. 15A to 15H show further alternatives of the RF filters in FIGS. 14A to 14H, wherein a further impedance element directly interconnects the signal input and the signal output with one another. A bridging inductive element or other embodiments of impedance converters can be used as an alternative to the bridging capacitive element.

Figure 16:
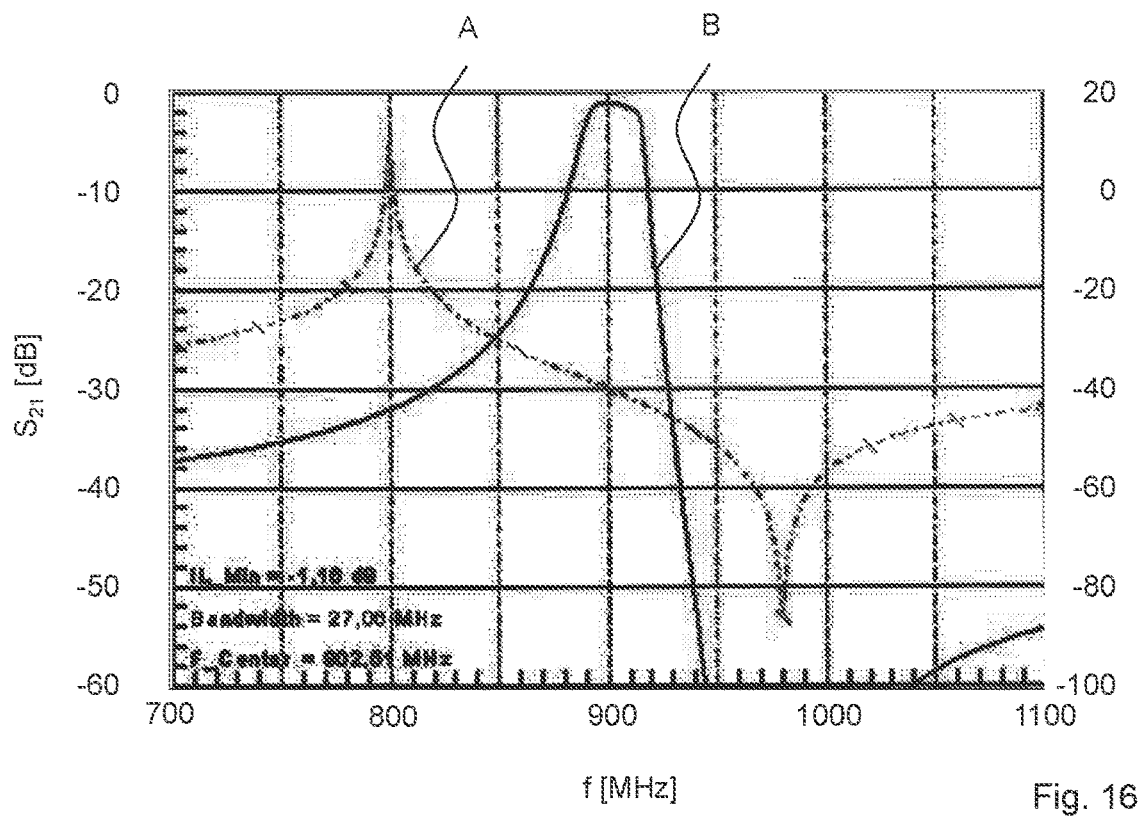
FIG. 16 shows the insertion loss of a resonator (A) and of a corresponding bandpass filter (B)

FIG. 16 shows the admittance of a resonator (curve A) and the transfer function of an RF filter having such a resonator (curve B). Serial capacitive elements have a value of 2.4 pF. Parallel capacitive elements have a value of 0.19 pF.

Figure 17:
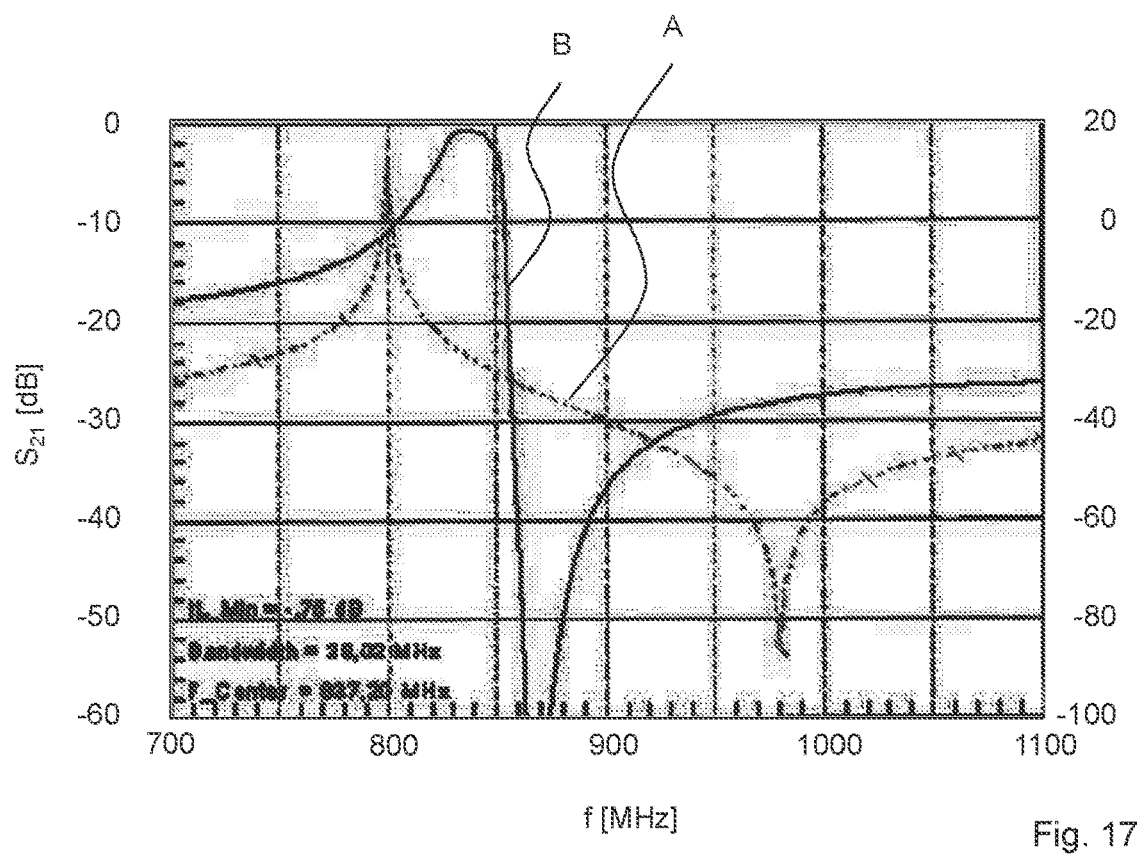
FIG. 17 shows the transmission curves of the RF filter from FIG. 16, wherein tunable impedance elements are altered in terms of their impedance in order to obtain a new position of the passband B.

FIG. 17 shows the corresponding curves, wherein serial tunable capacitances have been set to a capacitance value of 30 pF and parallel tunable capacitances have been set to a capacitance value of 3.7 pF. The impedance converters of the filters associated with FIGS. 16 and 17 are impedance inverters. The resonators are series resonators.

Figure 18:
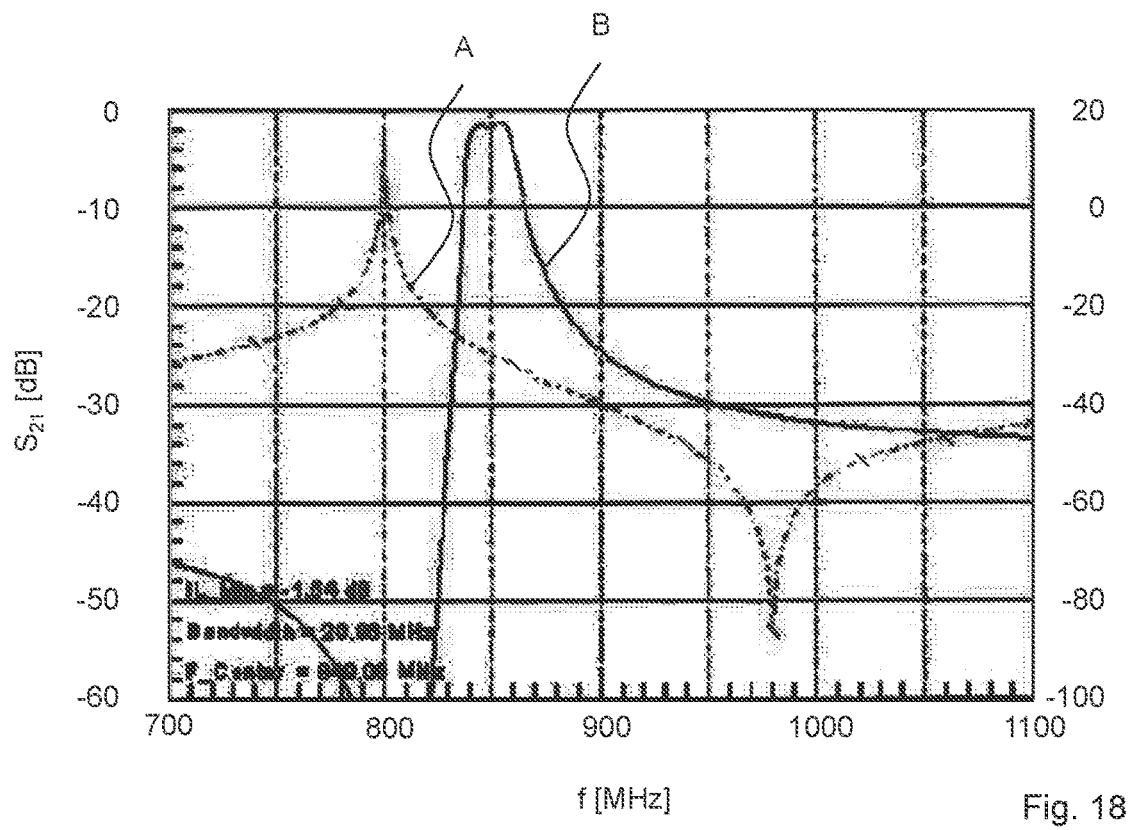
FIG. 18 shows the admittance (A) of a resonator and the insertion loss (B) of a corresponding bandpass filter with admittance inverters.
Figure 19:
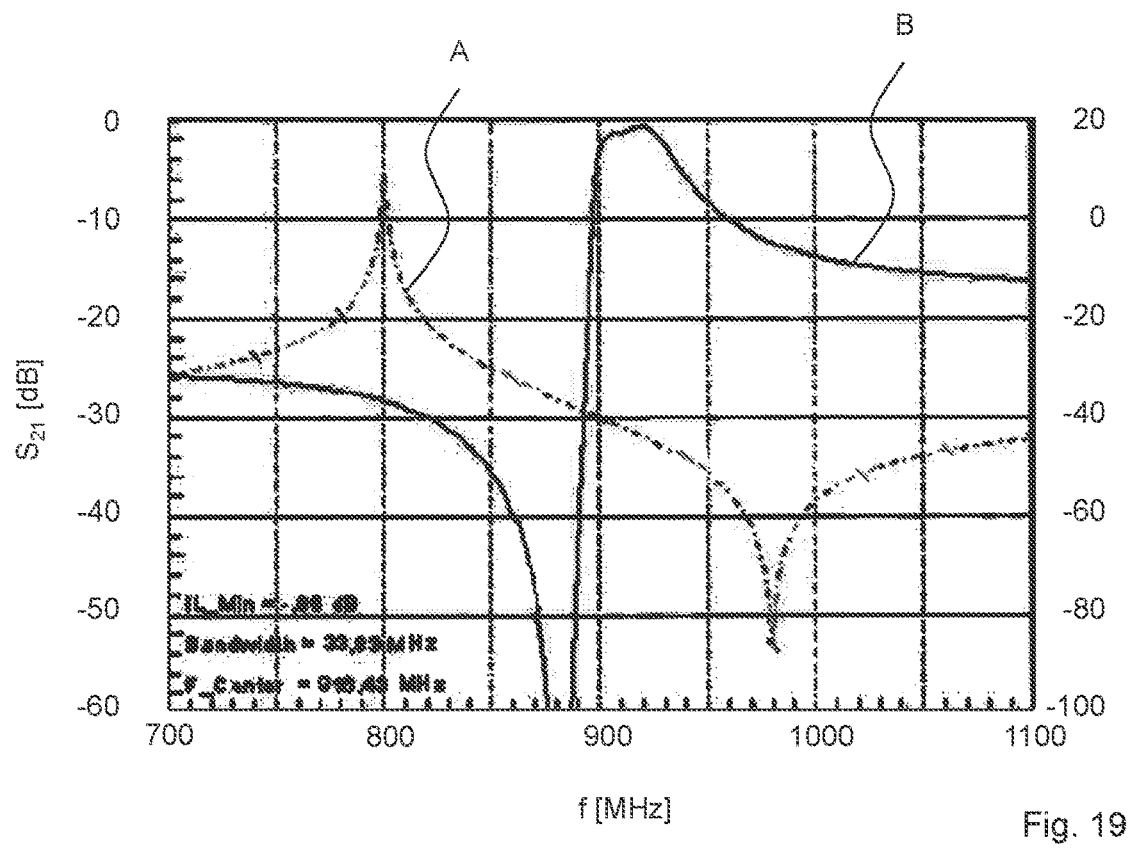
FIG. 19 shows the RF filter regarding FIG. 18, wherein impedance values of tunable impedance elements were varied in order to obtain an altered position of the passband.

In comparison therewith, FIGS. 18 and 19 show corresponding curves of RF filters having admittance inverters and parallel resonators. In this case, FIG. 18 shows the characteristic curves of a filter in which serial tunable capacitances have a value of 2.4 pF and parallel tunable capacitive elements have a value of 0.19 pF.

FIG. 19 shows the corresponding curves of the RF filter in which the serial tunable capacitances have a value of 30 pF and the parallel tunable capacitances have a value of 3.7 pF.

Figure 20:
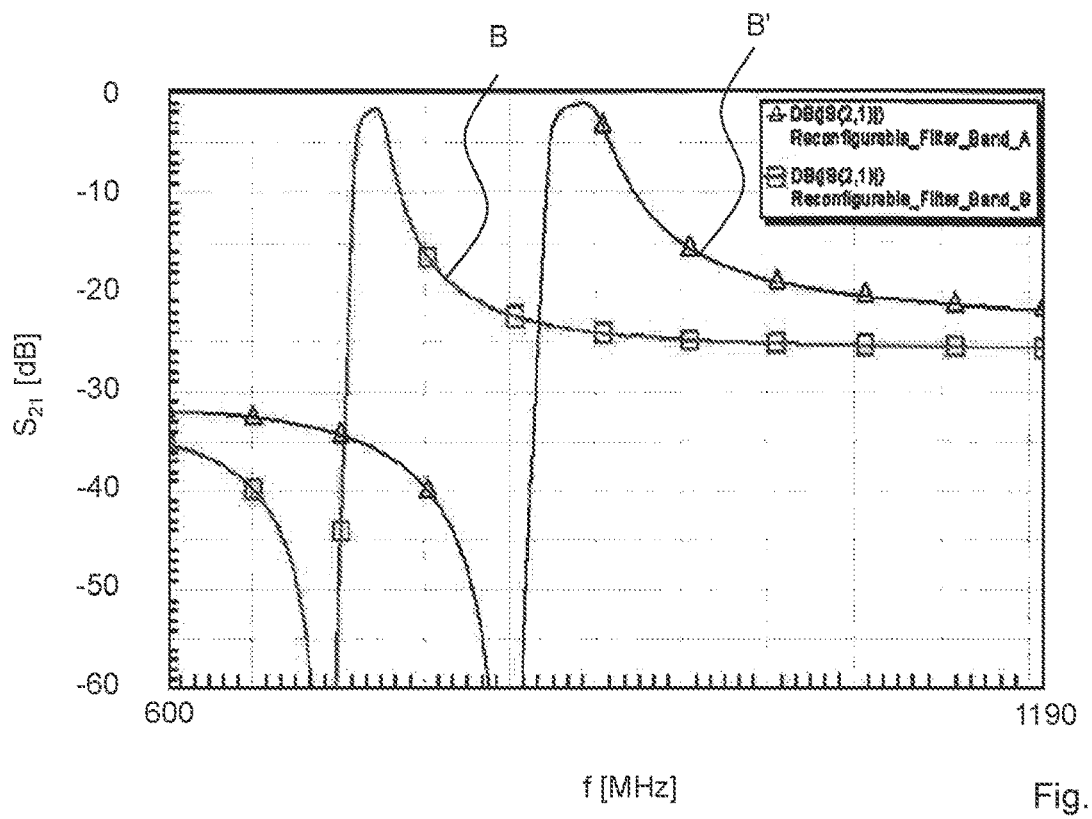
FIG. 20 shows insertion losses (B, B') of an RF filter in which different frequency positions of the passband are obtained by the tuning of resonators.

FIG. 20 shows insertion losses of bandpass filters having admittance inverters and parallel resonators. The filter comprises tunable resonators which are tuned by adjustable capacitances of capacitive elements once to the reception band 17 and band 5, respectively. In this case, the resonators comprise resonator elements that are coupleable by means of switches, as shown in FIG. 10B.

Figure 21:
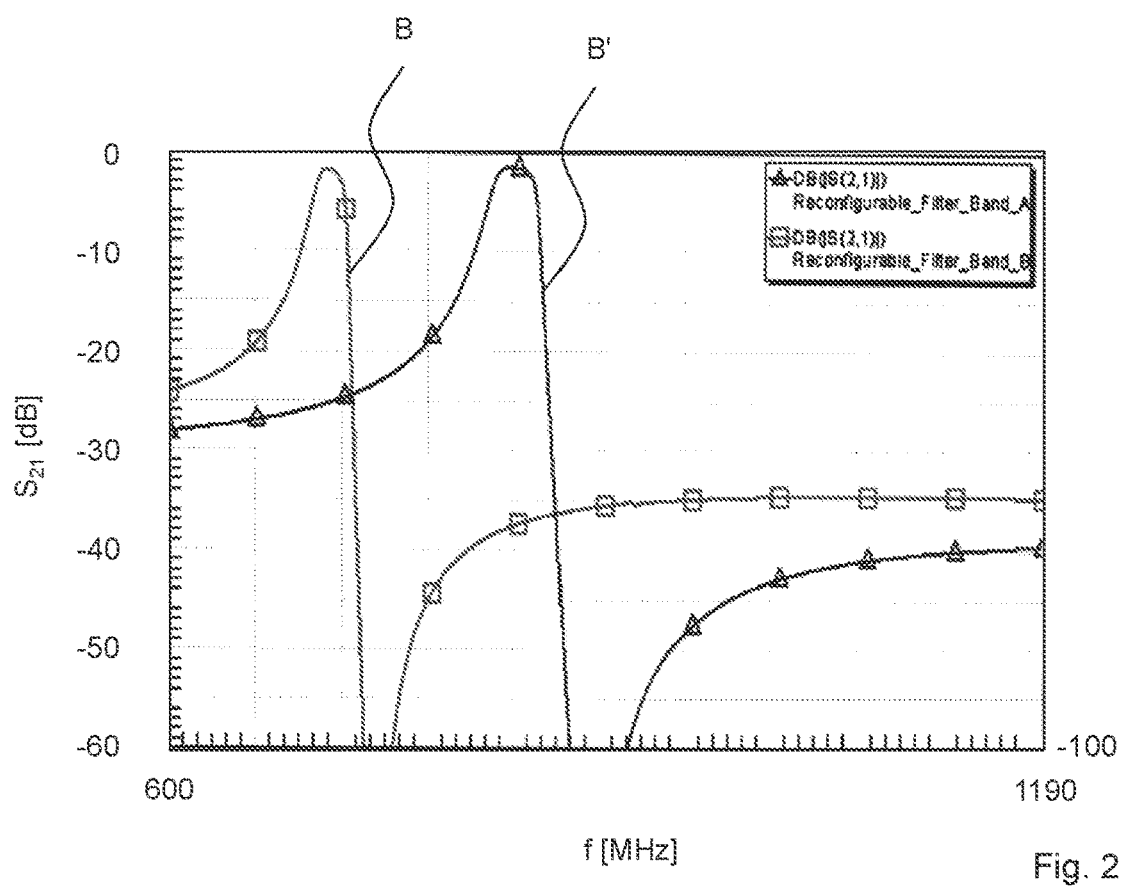
FIG. 21 shows different transmission curves (B, B') of an RF filter having parallel resonators and admittance inverters in which different impedance values bring about different positions of the passband.

FIG. 21 here shows transmission curves of an RF filter having impedance inverters and series resonators, wherein the tunable values are tuned once to the transmission frequencies of the band 17 and once to the transmission frequencies of the band 5. The resonators here comprise resonator elements that are coupleable by means of switches, as shown in FIG. 10A.

Figure 22:
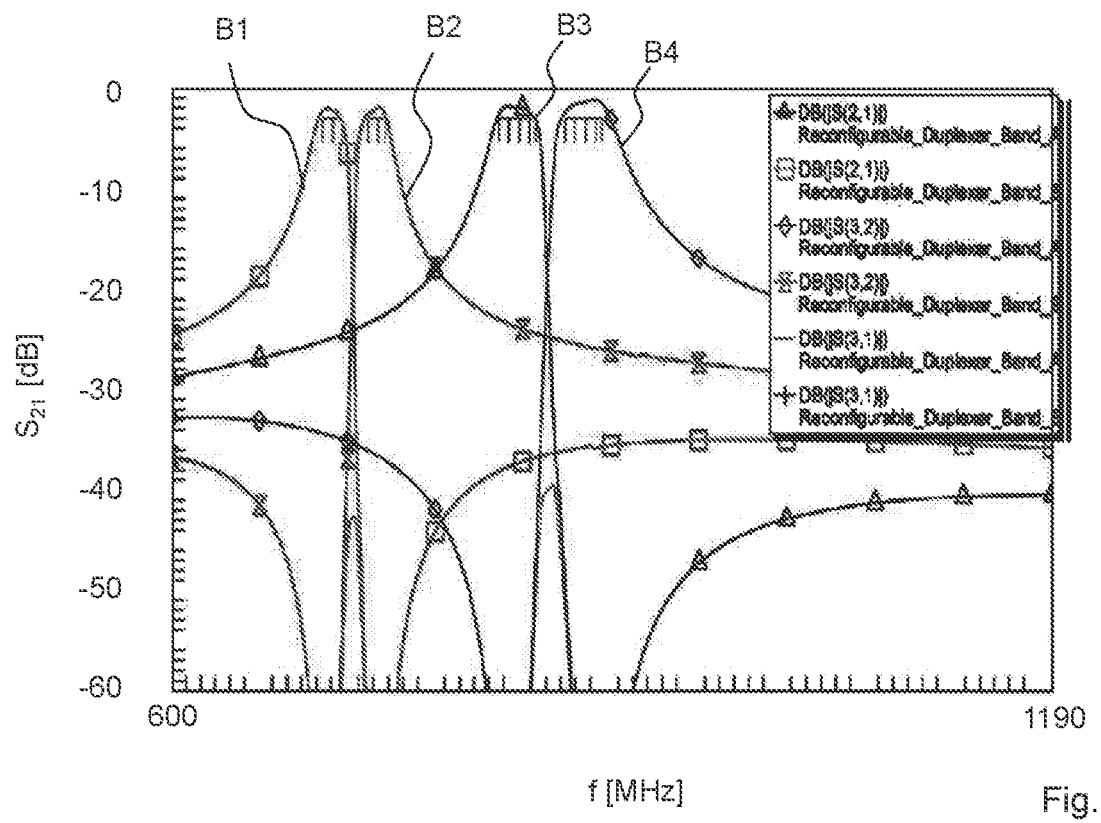
FIG. 22 shows insertion losses of a tunable duplexer: the curves $B_1$ and $B_3$ here denote a tunable transmission frequency band. The curves $B_2$ and $B_4$ represent the insertion losses of an adjustable reception frequency band.

FIG. 22 shows the insertion losses of the reception and transmission filters of a tunable duplexer, tuned once to band 17 and once to band 15.

Figure 23:
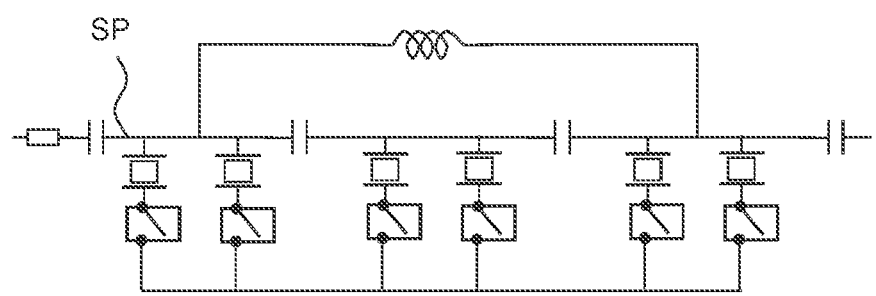
FIG. 23 shows a possible filter circuit.

FIG. 23 shows a possible embodiment of the RF filter. Four capacitive elements are interconnected in series in the signal path SP. A respective switchable resonator is interconnected in six transverse branches relative to ground. Each of the switchable resonators comprises a resonator element and a switch interconnected in series therewith. An inductive element is connected in parallel with two of the four capacitive elements.

Figure 24:
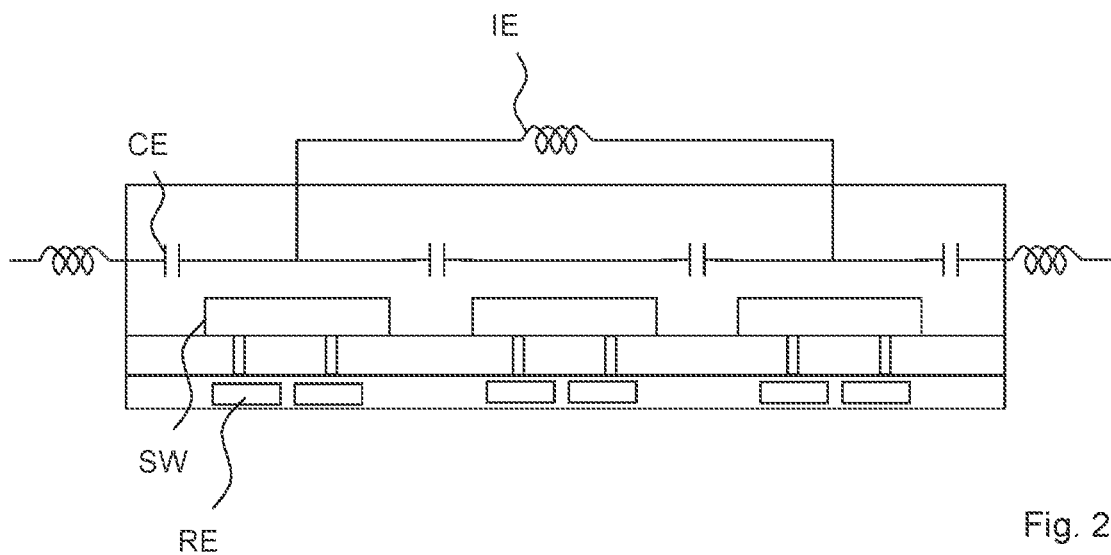
FIG. 24 shows one possible form of the integration of circuit components in a device.

FIG. 24 shows how circuit components of the filter circuit can advantageously be integrated in a multilayered module. The capacitive elements CE can be realized as MIM capacitors (MIM=metal insulator metal) together with sections of the signal path in one layer. The switches SW can be realized at the bottom of this layer. In a layer situated underneath, plated-through holes can be led which constitute lines of an interface between (semiconductor) switches and the resonator elements. The resonator elements, e.g., as SAW, BAW, GBAW, . . . etc. elements, can then be arranged below the layer having the interface.

Figure 25:
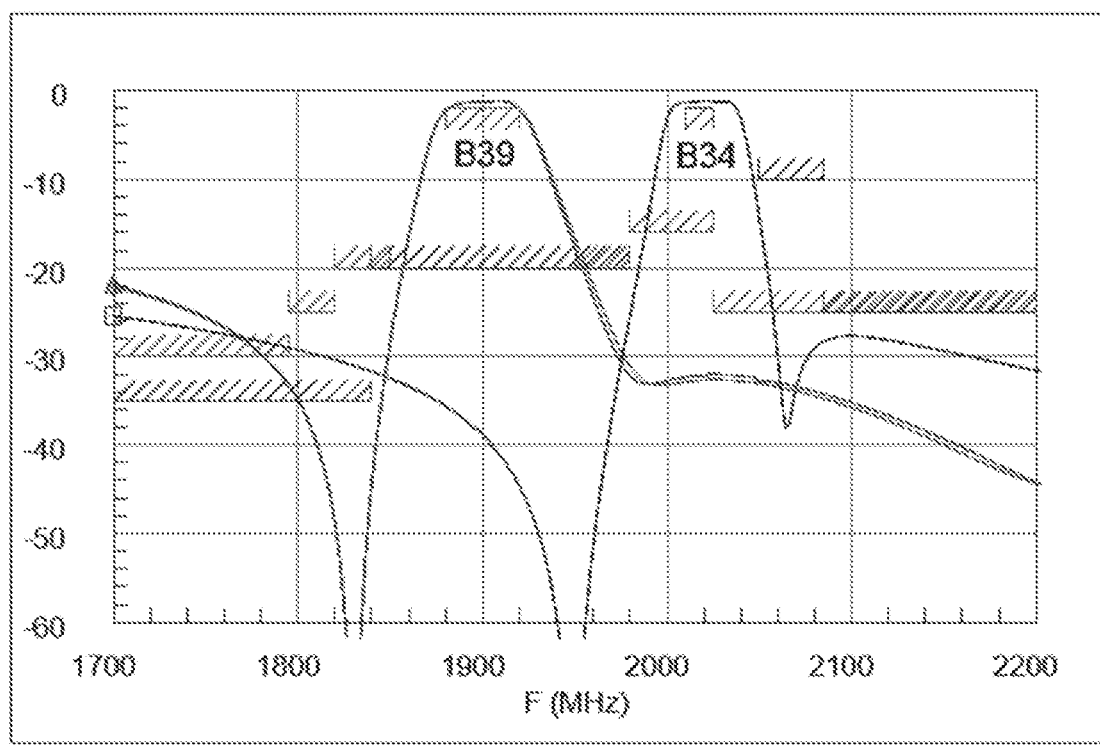
FIG. 25 shows transfer functions of a tunable filter according to FIG. 23.

FIG. 25 shows calculated transmission curves for the bands 34 and 39, between which it is possible to switch over by means of switches.

RF filters or duplexers having RF filters can furthermore comprise additional resonators or impedance elements, in particular tunable impedance elements.

The invention claimed is:

1. An RF filter comprising:
   four capacitive elements connected in series on a signal path;
   six resonators elements, each resonator element connected between the signal path and ground such that two of said six resonators are coupled to the signal path between a first and second of said four capacitive elements, two of said six resonators are coupled to the signal path between the second and a third of said four capacitive elements, and two of said six resonators are coupled to the signal path between the third and a fourth of said four capacitive elements;
   six switches, each of said six switches coupled to a respective one of said six resonator elements between the signal path and ground;
   an inductive element coupled in parallel to the second and third capacitive elements.

2. The RF filter according to claim 1 wherein the RF filter is formed in a multilayer module wherein the capacitive elements and at least a portion of the signal line is formed in a first layer.

3. The RF filter according to claim 2 wherein the switches are formed in the first layer.

4. The RF filter according to claim 2 wherein the resonator elements are formed in a second layer.

5. The RF filter according to claim 2 wherein inductive element is connected to the multilayer module.

6. The RF filter according to claim 2 wherein the capacitive elements are MIM capacitors.

7. The RF filter according to claim 1 wherein the capacitive elements are MIM capacitors.

* * * * *